(12) United States Patent
Amano et al.

(10) Patent No.: US 9,395,753 B2
(45) Date of Patent: Jul. 19, 2016

(54) COVER WITH WRITING INSTRUMENT COMPARTMENT

(71) Applicant: LENOVO (SINGAPORE) PTE. LTD., Singapore (SG)

(72) Inventors: Masayuki Amano, Kanagawa-ken (JP); Yasumichi Tsukamoto, Kanagawa-ken (JP); Shinnosuke Takahashi, Kanagawa-ken (JP); Tomoyuki Takahashi, Kanagawa-ken (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 150 days.

(21) Appl. No.: 14/259,050

(22) Filed: Apr. 22, 2014

(65) Prior Publication Data
US 2015/0298859 A1    Oct. 22, 2015

(51) Int. Cl.
*B65D 25/00* (2006.01)
*G06F 1/16* (2006.01)
*H05K 5/03* (2006.01)
*H05K 5/02* (2006.01)

(52) U.S. Cl.
CPC ............ *G06F 1/1626* (2013.01); *B65D 25/005* (2013.01); *H05K 5/0226* (2013.01); *H05K 5/03* (2013.01); *G06F 2200/1632* (2013.01); *G06F 2200/1633* (2013.01); *G06F 2200/1634* (2013.01)

(58) Field of Classification Search
CPC . G06F 3/03545; G06F 1/1626; G06F 1/1633; G06F 2200/1632; G06F 1/16; G06F 1/1632; G06F 1/1634; H05K 5/03; H05K 5/0017; H05K 5/02; H05K 5/0226; B65D 25/005
USPC ............... 361/679.23, 679.18, 679.1, 679.01, 361/679.02, 679.21, 679.26, 679.27, 361/679.55–679.56, 679.3
See application file for complete search history.

(56) References Cited

U.S. PATENT DOCUMENTS

| 5,796,575 A | 8/1998 | Podwalny et al. |
| 6,239,968 B1 * | 5/2001 | Kim ...................... G06F 1/1626 206/320 |
| 2011/0102979 A1 * | 5/2011 | Jinkinson .............. G06F 1/1616 361/679.01 |

* cited by examiner

*Primary Examiner* — Anthony Haughton
*Assistant Examiner* — Ingrid Wright
(74) *Attorney, Agent, or Firm* — Shimokaji IP

(57) ABSTRACT

A holder provides a movable wall for storing a writing instrument. The holder may store the writing instrument in a protected compartment until a user may rotate the wall to expose the writing instrument to access. In some embodiments, the movable wall may be connected to a cover of an electronic device. Access to the writing instrument may be provided by opening or closing the cover which may move concurrently with the wall.

20 Claims, 4 Drawing Sheets

COVER WITH WRITING INSTRUMENT COMPARTMENT

BACKGROUND OF THE INVENTION

The present invention generally relates to electronic device accessories and, more particularly, to a cover with a writing instrument compartment.

Some electronic devices may be protected by covers to protect underlying displays. The electronic devices may provide for writing input to engage the device. Typically, a writing instrument may be held separately from the electronic device. For example, a writing instrument may be stored in a bag, in clothing, or some other storage that may be detached from the device. Such storage may typically result in lost instruments or may be inconvenient to access. Some electronic devices may include a hollow hinge to store a writing instrument. The writing instrument may be inserted into an end of the hinge (coaxial entry) into the hinge body. To access the writing instrument, the device may be tilted to release the instrument out the hinge end. In some arrangements, an end of the writing instrument may be held against the end of the hinge by a catch.

Some cover accessories may similarly have a coil binding or hinge A clip of the writing instrument may be attached to the hinge so that the instrument is coaxial with the hinge of the cover. Typically, insertion of the writing instrument into the hinge or binding may create interference between the cover and a device protected by the cover upon closing the cover.

Typically, exposure of the writing instrument end to the device or cover exterior may result in inadvertently knocking the writing instrument from its station thus losing the instrument. In addition, the writing instrument may constantly protrude from the cover even in times that the device is not in use, thus causing undesirable damage to the instrument or the user's environment should the instrument make contact with a foreign surface.

As can be seen, there is a need for a storage device that safely stores a writing instrument for an electronic device until a user may actually need access to the instrument.

SUMMARY OF THE INVENTION

In one aspect of the present invention, an accessory for storing a writing instrument comprises a holder configured to attach to an electronic device; wherein the holder includes: a longitudinal compartment in the holder configured to hold the writing instrument coaxially with a longitudinal axis of the compartment; and a rotatable wall of the holder, the rotatable wall configured to provide access to the compartment.

In another aspect of the present invention, an instrument with an electronic device, comprises a cover configured to store an electronic device; a hinge coupled to the cover; a compartment in the hinge configured to hold the writing instrument; and a wall of the hinge movable with an opening or closing of the cover, wherein the wall includes an opening.

In another aspect of the present invention, an electronic device system comprises an electronic device; a cover coupled to the electronic device; a hinge coupled to the cover; a compartment in the hinge configured to hold a writing instrument; and a wall of the hinge, the wall including an opening disposed to release the writing instrument in a radial direction from the hinge.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features. However, any single inventive feature may not address any of the problems discussed above or may only address one of the problems discussed above. Further, one or more of the problems discussed above may not be fully addressed by any of the features described below.

The present invention generally provides convenience and storage for a writing instrument stored with an electronic device. The writing instrument may be safely stowed away and kept from falling or sliding out of its storage. In some embodiments, access to the writing instrument may be provided in conjunction with gaining access to the electronic device. Thus, use of the writing instrument may be coordinated with the need to utilize the electronic device.

Figure 1:
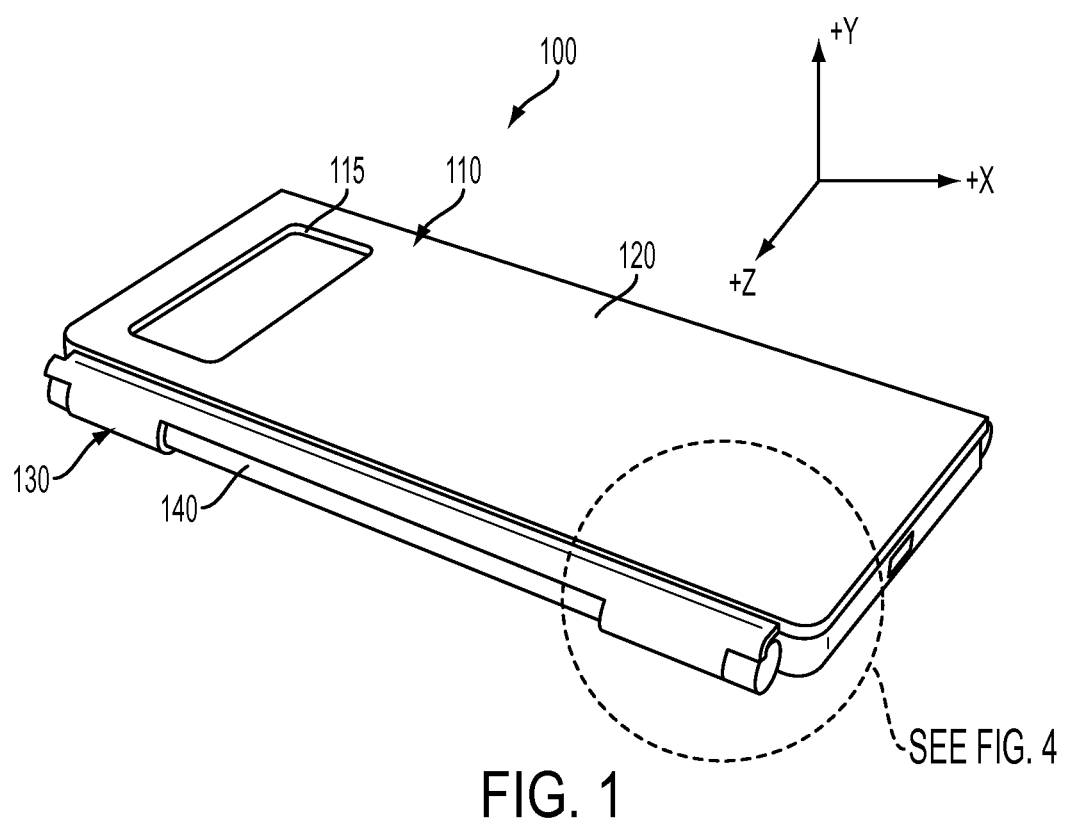
FIG. 1 is a top perspective view of an electronic device system according to an exemplary embodiment of the present invention.

Referring to FIG. 1, an electronic device system 100 is shown according to an exemplary embodiment of the present invention. The electronic device system 100 may generally include an electronic device 110 and a writing instrument holder 130. Reference to the length, width or height of the electronic device 110 is made with respect to the X-Y-Z coordinate system shown where the X-axis may represent the length, the Y-axis may represent the height, and the Z-axis may represent the width of the electronic device 110. The electronic device 110 may include an electronic display 115. The electronic device 110 may be protected by a cover 120. In some embodiments, the cover 120 may be integral with the electronic device 110 and in other embodiments the cover 120 may be an accessory that is detachable from the electronic device 110.

In an exemplary embodiment, the writing instrument holder 130 may be integral with the cover 120. However, it will be understood that in some embodiments, the holder 130 may be detachable from either the electronic device 110 or the cover 120. The writing instrument holder 130 may store a writing instrument 140. The writing instrument 140 may be for example a pen or a stylus. FIG. 1 shows the writing instrument 140 in a stored and inaccessible state as the cover 120 is in a closed state covering the display 115.

Figure 2A:
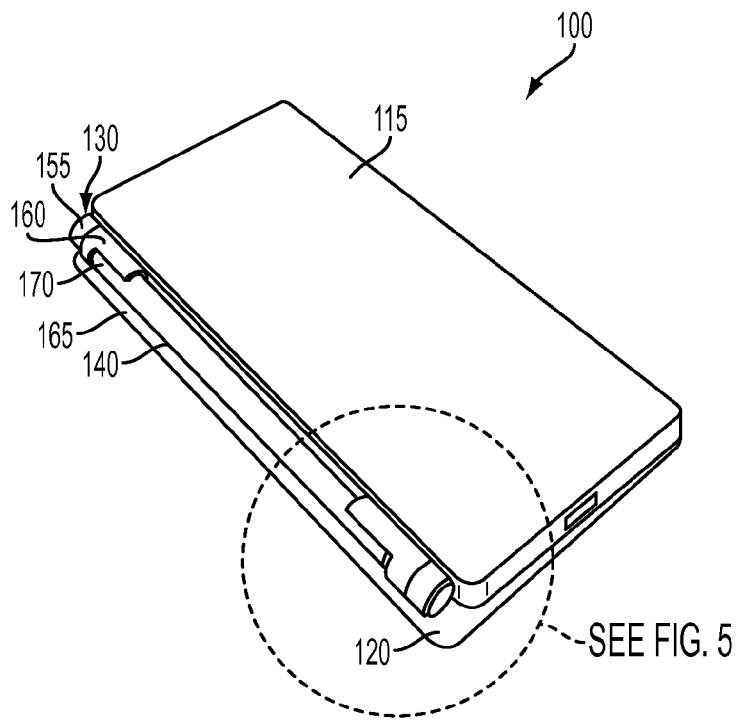
FIG. 2A is a top perspective view of the electronic device system of FIG. 1 shown with a cover opened and movable wall rotated.
Figure 2B:
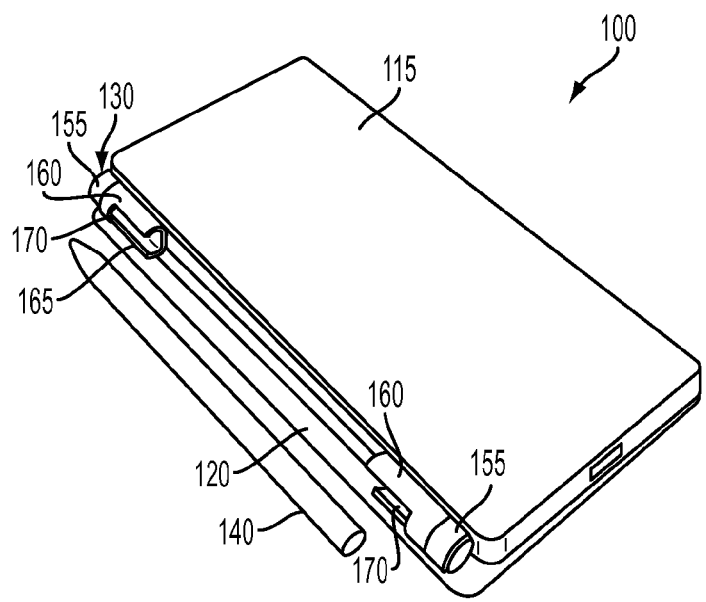
FIG. 2B shows the electronic device system of FIG. 2A with a writing instrument exploded from storage within the movable wall.

Referring now to FIGS. 2A and 2B, an exemplary embodiment of the writing instrument holder 130 provided in the form of a hinge is shown. In FIGS. 2A and 2B, the cover 120 is shown in an open state and is rotated around the holder 130 and adjacent to the rear of the electronic device 110.

In FIG. 2A, the writing instrument 140 is shown in an accessible, open state. In FIG. 2B, the writing instrument 140 is shown as removable from the electronic device system 100 by virtue of the features described herein. The writing instrument holder 130 may generally include a movable wall 160. The movable wall 160 may be rotatable to provide access to a storage compartment 170 configured to detain the writing instrument 140. When the holder 130 is provided in the form of a hinge, the movable wall 160 may be for example a barrel inserted into a hinge cap 155. In the following, the movable wall 160 may also be referred to as the barrel 160. The holder 130 may also be referred to as the hinge 130.

While FIGS. 2A and 2B show a pair of barrels 160 on opposing ends of the hinge 130, it will be understood that some embodiments may use only a single barrel 160. An opening 165 may be positioned on a circumferential wall of the barrel 160. The opening 165 may be configured to provide entry and egress of the writing instrument 140 into the compartment 170. In some embodiments the opening 165 is configured for press fit receipt of the writing instrument 140. The barrel 160 may rotate within the hinge cap 155 so that the opening 165 is rotatable around the writing instrument 140. In some embodiments, the movable wall 160 is attached to the cover 120 so that opening or closing the cover 120 rotates the opening 165.

Figure 3A:
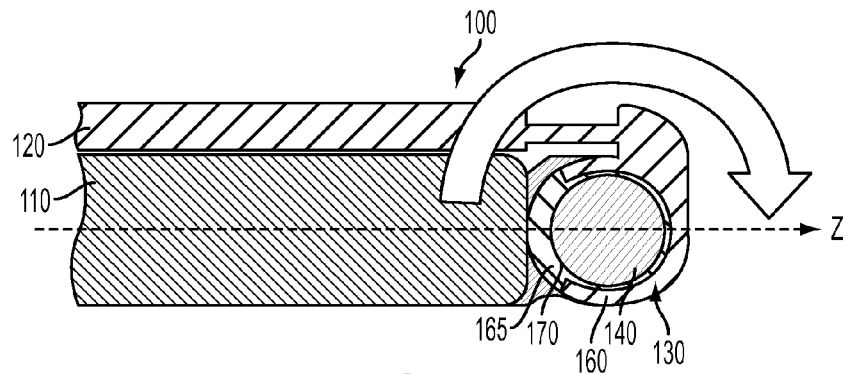
FIG. 3A is a cross-sectional end view of the electronic device system of FIG. 1 shown with the cover closed.
Figure 3B:
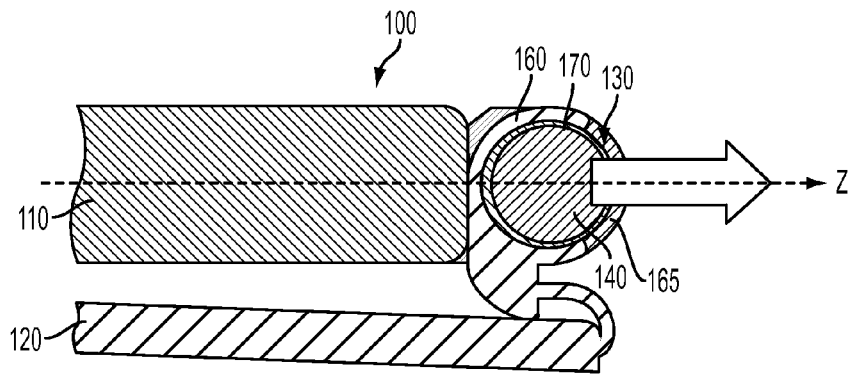
FIG. 3B is a cross-sectional end view of the electronic device system of FIG. 1 shown with the cover opened.
Figure 4:
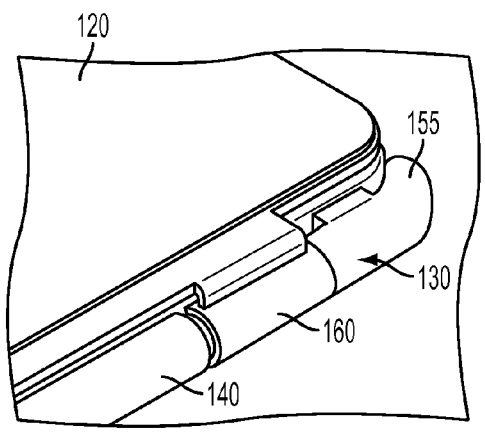
FIG. 4 is an enlarged partial view of the circle 4 of FIG. 1.

Referring now to FIGS. 3A, 3B, 4, and 5, the opening 165 is shown at different positions as the cover 120 is opened or closed according to an exemplary embodiment of the present invention. In FIGS. 3A and 4, the cover 120 is shown in a closed state protecting the electronic device 110. In the closed state, the movable wall 160 may be positioned to prevent the writing instrument 140 from falling out of the compartment 170. For example, the movable wall 160 may be positioned so that the opening 165 may face toward the electronic device 110. The writing instrument 140 may thus be secured between the electronic device 110 and the movable wall 160.

Figure 5:
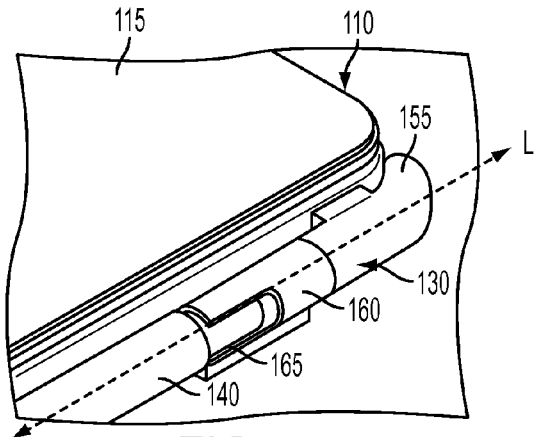
FIG. 5 is an enlarged partial view of the circle 5 of FIG. 2A.

The cover 120 may be rotated around the hinge 130 into an open state exposing the display 115 as shown in FIGS. 3B and 5 providing access to the writing instrument 140. For example, the movable wall 160 may be rotated as the cover 120 is opened so that the movable wall 160 is positioned intermediate the electronic device 110 and the opening 165. The opening 165 may face outward and away from the electronic device 110. The movable wall 160 may thus expose the writing instrument 140 to access by a user (not shown) and the writing instrument 140 may be released radially outward (with respect to a longitudinal axis L of the hinge 130 as shown in FIG. 5) from the compartment 170. While the opening 165 is shown as aligned with the width axis of the electronic device 110, it will be understood that the movable wall 160 may be configured so that the opening 165 is positioned perpendicular to the width axis of the electronic device 110 (for example, facing parallel to the height axis Y of the electronic device 110) while still providing clearance for release of the writing instrument 140. In some embodiments, the opening 165 may be smaller than the diameter of the writing instrument 140. The movable wall 160 may be flexible so that the writing instrument 140 may be press fit through the opening 165 when stored into the compartment 170.

Referring now to FIGS. 6A, 6B, 6C, and 6D, a relationship between the cover 120 and the movable wall 160 is shown according to an exemplary embodiment of the present invention. In some embodiments, the cover 120 may include a flexible joint 180 connecting the cover 120 to the movable wall 160. The rotation of the cover 120 around the joint 180 may be at least partly independent of the rotation of the movable wall 160 around the longitudinal axis L of the hinge 130.

Figure 6A:
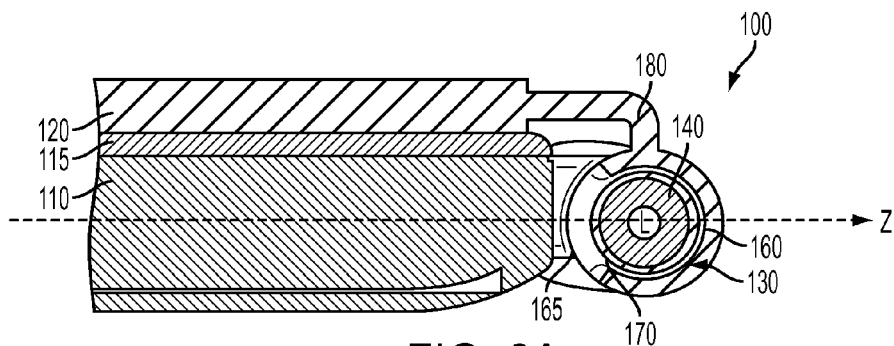
FIGS. 6A, 6B, 6C, and 6D are a series of cross-sectional end views showing a relationship between rotation of the cover and rotation of the movable wall of the electronic device system of FIG. 1.

For example, in FIG. 6A, the cover 120 may be in a default closed state or 0 degrees open (rotation may be relative to the longitudinal axis L in the hinge 130). The movable wall 160 may concurrently be in a closed state so that the opening 165 may be facing the electronic device 110.

Figure 6B:
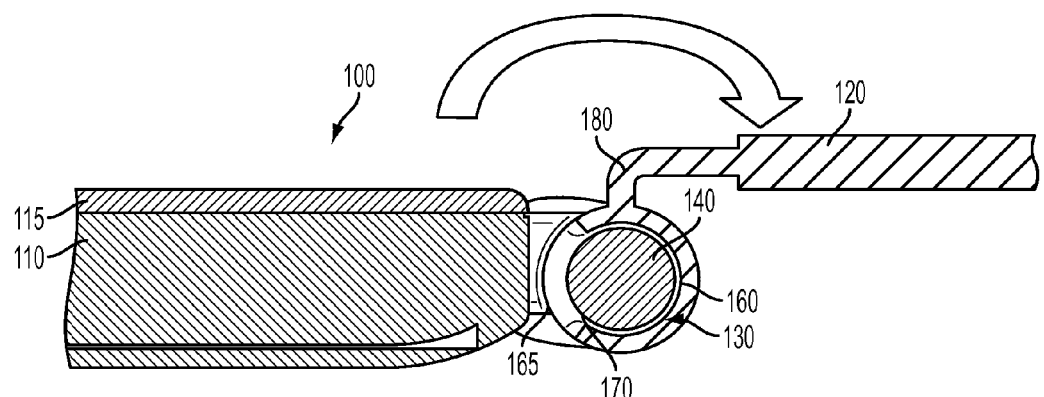

In FIG. 6B, the cover 120 may be rotated open to about 180 degrees from the display 115. In some exemplary uses, a user may only need to access the display 115 without needing to use the writing instrument 140. For example, the cover 120 may pivot about the joint 180 without affecting the movable wall 160 which may remain in its default closed state with the opening 165 continuing to face the electronic device 110.

Figure 6C:
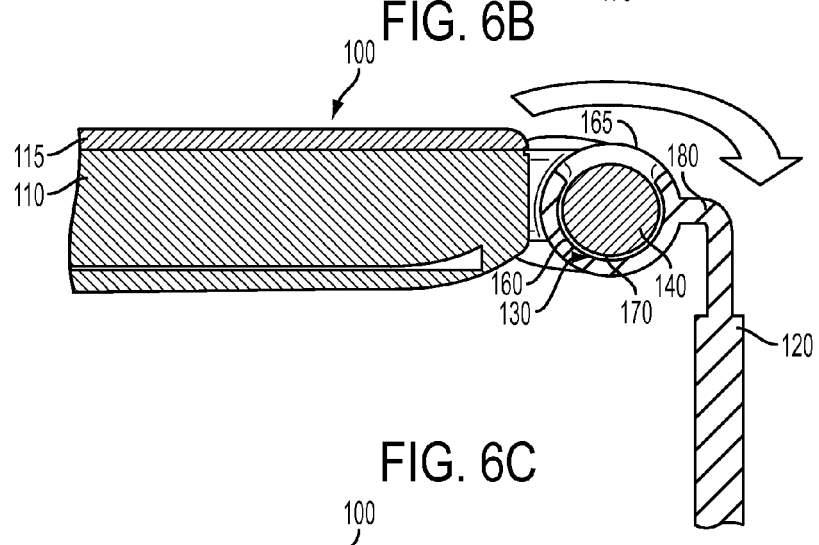

Referring to FIG. 6C, in the event the user does desire access to the writing instrument 140, the cover 120 may be further rotated (shown at approximately 270 degrees from the closed state). Rotating the cover 120 beyond 180 degrees may rotate the movable wall 160 out of the closed state such that the opening 165 may become accessible to the user. In the exemplary embodiment show, rotation of the cover 120 by 270 degrees may provide approximately 90 degrees of rotation by the movable wall 160. In some cases, the user may find this rotation sufficient to access the writing instrument 140.

Figure 6D:
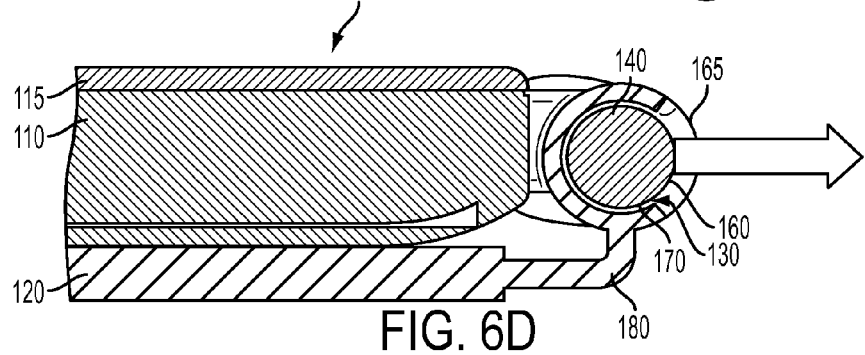

Referring to FIG. 6D, the cover 120 may be fully rotated around the hinge 130 so that the cover 120 engages an underside of the electronic device 110. When the cover 120 is fully rotated (which may be less than 360 degrees due to the thickness of the electronic device 110), the movable wall 160 may be rotated approximately 180 degrees from its default position so that the opening 165 faces radially outward from the electronic device 110 (for example pointing along the width axis Z). Thus, access to the writing instrument 140 may be conveniently provided to the user since the writing instrument 140 may be radially releasable from the hinge 130.

It should be understood, of course, that the foregoing relates to exemplary embodiments of the invention and that modifications may be made without departing from the spirit and scope of the invention as set forth in the following claims.

What is claimed is:

1. An accessory for storing a writing instrument, comprising:
    a holder configured to attach to an electronic device;
    wherein the holder includes:
        a longitudinal compartment; and
        a movable wall of the compartment, the movable wall configured to provide access to the compartment, wherein the movable wall comprises a barrel rotatably coupled to a hinge cap, wherein the movable wall is movable between an open position and a closed position of the compartment via rotation of the barrel,
        wherein the compartment is configured to open on a side opposite the electronic device when the holder is attached to the electronic device.

2. The accessory of claim 1, wherein the movable wall is configured to enclose the writing instrument in the compartment.

3. The accessory of claim 1, wherein the movable wall is configured to rotate around the writing instrument and enclose the writing instrument.

4. The accessory of claim 1, wherein the movable wall includes an opening configured to move into position to receive the writing instrument in response to rotation of the rotatable wall.

5. The accessory of claim 4, wherein the opening of the movable wall is configured to receive the writing instrument by press fit.

6. An accessory for storing a writing instrument with an electronic device, comprising:
 a cover;
 a hinge coupled to the cover;
 a compartment in the hinge; and
 a wall of the hinge movable with opening or closing of the cover, the wall comprising a barrel coupled to a hinge cap, wherein the barrel is rotatable within the hinge cap, wherein the compartment is configured to open on a side of the hinge opposite the electronic device
 wherein the wall is movable between an open and closed position of the compartment via rotation of the barrel.

7. The accessory of claim 6, wherein the cover is configured to open through a first range of rotation around the hinge, and the wall of the hinge is configured to rotate through a second range of rotation around the hinge, the second range of rotation being less than the first range of rotation.

8. The accessory of claim 7, wherein the first range of rotation is between 0 degrees and less than 360 degrees and the second range of rotation is between 0 degrees and 180 degrees.

9. The accessory of claim 6, wherein the wall rotates around the compartment in response to the opening or closing of the cover.

10. The accessory of claim 9, wherein the opening of the wall is configured to face toward the electronic device in response to the closing of the cover in the closed position and wherein the compartment is configured to open on a side opposite the electronic device in the open position.

11. The accessory of claim 10, wherein the opening of the wall is configured to face away from the electronic device in response to the opening of the cover.

12. The accessory of claim 6, wherein the opening in the wall is disposed to release the writing instrument in a radial direction from the hinge.

13. The accessory of claim 6, wherein the wall is configured to receive the writing instrument via press fit into the opening of the wall.

14. An electronic device system, comprising:
 an electronic device;
 a cover coupled to the electronic device;
 a hinge coupled to the cover;
 a compartment in the hinge configured to hold a writing instrument; and
a rotatable wall of the hinge, the wall including an opening disposed to release the writing instrument in a radial direction from the hinge wherein the cover is rotatable around the hinge, wherein the wall is configured to optionally rotate with a rotation of the cover, and wherein the cover is configured to partially rotate without affecting the wall.

15. The electronic device system of claim 14, wherein the opening is positioned on a circumferential sidewall of the hinge.

16. The electronic device system of claim 14, wherein the hinge is rotatable around a longitudinal axis of the hinge.

17. The electronic device system of claim 16, wherein the opening is exposed via the cover being rotated around the longitudinal axis and into an open position.

18. The electronic device system of claim 14, further comprising a flexible joint coupling the cover to the hinge, the joint configured open the cover independently of the hinge.

19. The electronic device system of claim 14, wherein the wall is configured to rotate around the compartment in response to the opening or closing of the cover.

20. The electronic device system of claim 19, wherein the opening of the wall is configured to face toward the electronic device in response to the closing of the cover.

* * * * *